United States Patent
Neumann et al.

(10) Patent No.: US 7,742,310 B2
(45) Date of Patent: Jun. 22, 2010

(54) SEQUENCER

(75) Inventors: Matthew D. Neumann, Roseville, CA (US); Bryan Bolich, Davis, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 826 days.

(21) Appl. No.: 11/541,084

(22) Filed: Sep. 29, 2006

(65) Prior Publication Data

US 2008/0080150 A1    Apr. 3, 2008

(51) Int. Cl.
*H05K 5/00* (2006.01)

(52) U.S. Cl. .............................. 361/759; 361/803

(58) Field of Classification Search ............... 361/759, 361/760, 800, 807, 810
See application file for complete search history.

(56) References Cited

U.S. PATENT DOCUMENTS

| | | | |
|---|---|---|---|
| 4,321,423 A | 3/1982 | Johnson et al. |
| 4,403,102 A | 9/1983 | Jordan et al. |
| 4,487,300 A | 12/1984 | Hammond |
| 4,596,907 A | 6/1986 | Lagreco et al. |
| 4,631,639 A | 12/1986 | Biraud |
| 4,665,467 A | 5/1987 | Speraw et al. |
| 4,703,567 A | 11/1987 | Moore et al. |
| 4,709,302 A | 11/1987 | Jordan et al. |
| 4,721,996 A | 1/1988 | Tustaniwskyi et al. |
| 4,744,799 A | 5/1988 | Woodman, Jr. et al. |
| 4,942,498 A | 7/1990 | Toussaint |
| 4,951,176 A | 8/1990 | Bergfried et al. |
| 4,953,061 A | 8/1990 | Nitkiewicz |
| 5,045,976 A | 9/1991 | Guilleminot |
| 5,050,038 A | 9/1991 | Malaurie et al. |
| 5,144,535 A | 9/1992 | Megens et al. |
| 5,179,506 A | 1/1993 | Corbett et al. |
| 5,206,792 A | 4/1993 | Reynolds |
| 5,221,811 A | 6/1993 | Seldin |
| 5,274,193 A | 12/1993 | Bailey et al. |
| 5,276,585 A | 1/1994 | Smithers |
| 5,311,395 A | 5/1994 | McGaha et al. |
| 5,365,408 A | 11/1994 | Apitz |
| 5,379,188 A | 1/1995 | Winslow |
| 5,477,420 A | 12/1995 | Brooks |
| 5,548,487 A | 8/1996 | Brabetz et al. |
| 5,651,688 A | 7/1997 | Lin |
| 5,742,844 A | 4/1998 | Feldman |
| 5,748,446 A | 5/1998 | Feightner et al. |
| 5,754,400 A | 5/1998 | Sathe et al. |
| 5,764,485 A | 6/1998 | Lebaschi et al. |
| 5,870,287 A | 2/1999 | Rodriguez et al. |
| 5,886,871 A | 3/1999 | Jeffries et al. |
| 5,896,270 A | 4/1999 | Tsui |
| 5,901,039 A | 5/1999 | Dehaine et al. |
| 5,920,120 A | 7/1999 | Webb et al. |
| 5,928,024 A | 7/1999 | Ming-Huang |
| 5,930,114 A | 7/1999 | Kuzmin et al. |
| 5,940,269 A | 8/1999 | Ko et al. |
| 5,940,279 A | 8/1999 | Gademann et al. |
| 5,958,556 A | 9/1999 | McCutcheon |
| 5,966,289 A | 10/1999 | Hastings et al. |

(Continued)

FOREIGN PATENT DOCUMENTS

FR    2605744    4/1988

*Primary Examiner*—Hung S Bui

(57) ABSTRACT

Various apparatus and methods relating to a sequencer for connecting an electronic device to a circuit board are disclosed.

17 Claims, 10 Drawing Sheets

U.S. PATENT DOCUMENTS

| | | |
|---|---|---|
| 5,986,887 A | 11/1999 | Smith et al. |
| 5,991,154 A | 11/1999 | Clemens et al. |
| 6,023,413 A | 2/2000 | Umezawa |
| 6,055,158 A | 4/2000 | Pavlovic |
| 6,067,231 A | 5/2000 | Lu |
| 6,075,208 A | 6/2000 | Persson |
| 6,075,710 A | 6/2000 | Lau |
| 6,084,781 A | 7/2000 | Klein |
| 6,108,205 A | 8/2000 | Bergstedt |
| 6,125,038 A | 9/2000 | Amaro et al. |
| 6,128,200 A | 10/2000 | Chu |
| 6,144,092 A | 11/2000 | Kappes et al. |
| 6,147,873 A | 11/2000 | Huang |
| 6,164,999 A * | 12/2000 | McCutchan et al. ......... 439/342 |
| 6,169,659 B1 | 1/2001 | Wheaton |
| 6,191,944 B1 | 2/2001 | Hammel et al. |
| 6,208,518 B1 | 3/2001 | Lee |
| 6,215,667 B1 | 4/2001 | Ady et al. |
| 6,229,705 B1 | 5/2001 | Lee |
| 6,233,152 B1 | 5/2001 | Abbott et al. |
| 6,239,974 B1 | 5/2001 | Tseng |
| 6,275,380 B1 | 8/2001 | Bollesen |
| 6,278,615 B1 | 8/2001 | Brezina et al. |
| 6,280,116 B1 | 8/2001 | Szu |
| 6,285,554 B1 | 9/2001 | Westburg |
| 6,297,444 B1 | 10/2001 | Chuang et al. |
| 6,301,115 B1 | 10/2001 | Hashimoto et al. |
| 6,304,449 B1 | 10/2001 | Zhang |
| 6,304,453 B1 | 10/2001 | Lo |
| 6,305,966 B1 | 10/2001 | Arbogast et al. |
| 6,310,771 B1 | 10/2001 | Chien |
| 6,310,779 B1 | 10/2001 | Wang |
| 6,320,748 B1 | 11/2001 | Roden et al. |
| 6,330,908 B1 | 12/2001 | Lee et al. |
| 6,330,996 B1 | 12/2001 | Yo et al. |
| 6,343,016 B1 | 1/2002 | Lin |
| 6,356,445 B1 | 3/2002 | Mochzuki et al. |
| 6,362,978 B1 | 3/2002 | Boe |
| 6,424,537 B1 | 7/2002 | Paquin et al. |
| 6,424,538 B1 | 7/2002 | Paquin |
| 6,426,875 B1 | 7/2002 | Akram et al. |
| 6,428,352 B1 | 8/2002 | Boyden |
| 6,434,007 B1 | 8/2002 | Salmonson et al. |
| 6,452,801 B1 | 9/2002 | Chen |
| 6,456,493 B1 | 9/2002 | Lee |
| 6,459,584 B1 | 10/2002 | Kuo |
| 6,477,051 B1 | 11/2002 | Barsun |
| 6,483,704 B2 | 11/2002 | Ulen et al. |
| 6,487,082 B1 | 11/2002 | Carpisi et al. |
| 6,496,372 B1 | 12/2002 | Davison et al. |
| 6,496,374 B1 | 12/2002 | Caldwell |
| 6,501,657 B1 | 12/2002 | Carr |
| 6,501,658 B2 | 12/2002 | Pearson et al. |
| 6,525,938 B1 | 2/2003 | Chen |
| 6,542,368 B2 | 4/2003 | Miyazawa |
| 6,542,369 B1 | 4/2003 | Wu |
| 6,563,213 B1 | 5/2003 | Wong et al. |
| 6,563,712 B2 | 5/2003 | Akram et al. |
| 6,570,763 B1 | 5/2003 | McHugh et al. |
| 6,590,772 B1 | 7/2003 | Ju |
| 6,921,276 B2 * | 7/2005 | McClinton ................. 439/342 |
| 2003/0053295 A1 | 3/2003 | Barsun et al. |

* cited by examiner

SEQUENCER

BACKGROUND

Electronic systems may include one or more electronic devices secure to a circuit board. Prior to such securement, a signal transmitting connection between the electronic device and the circuit board may need to be activated. Activation of the signal transmitting connection after securement of the electronic device to the circuit board may damage the signal transmitting connection, the electronic device or the circuit board.

DETAILED DESCRIPTION OF THE EXAMPLE EMBODIMENTS

Figure 1:
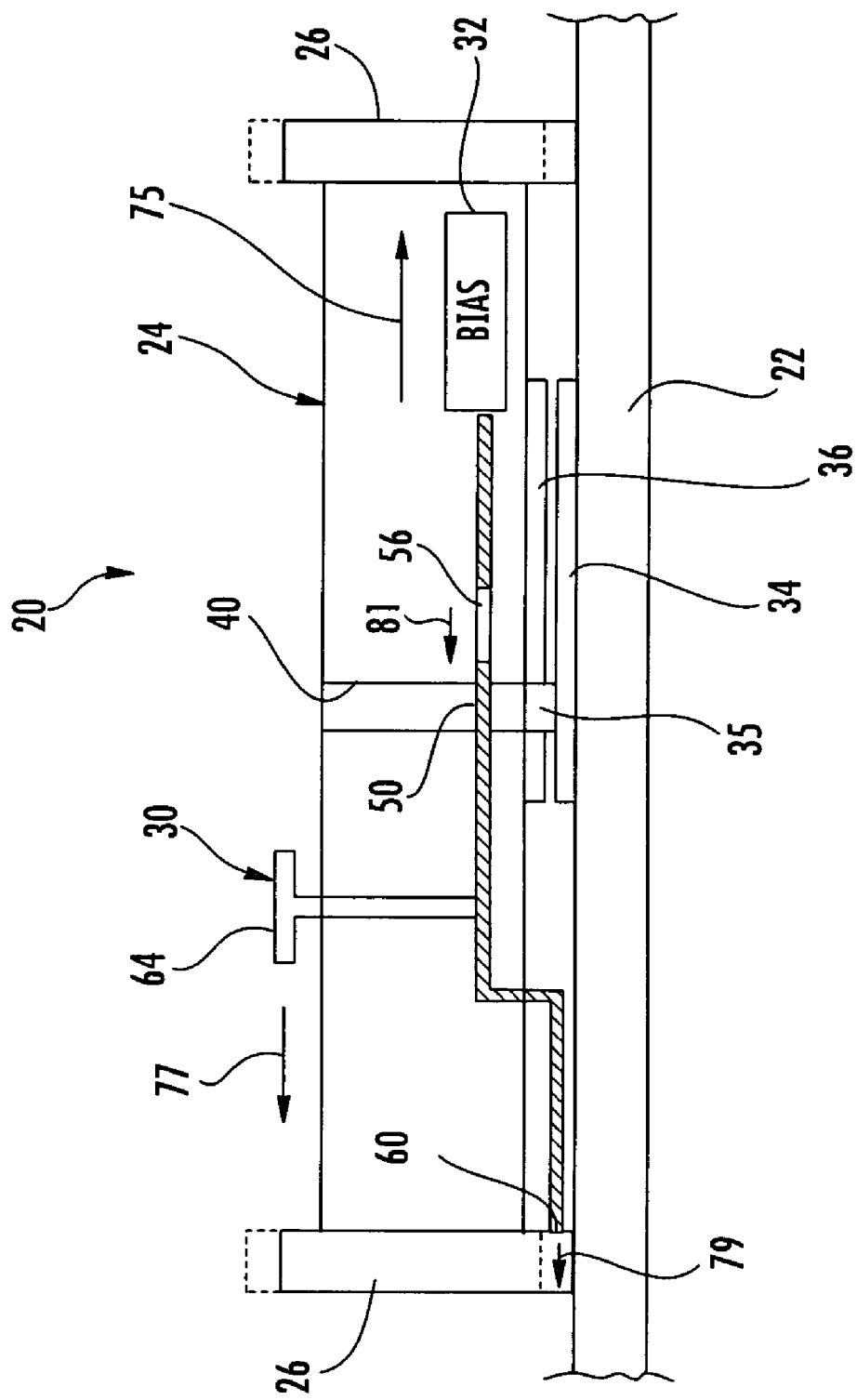
FIG. 1 is a schematic view of an electronic system according to an example embodiment.

FIG. 1 schematically illustrates electronic system 20 according to one example embodiment. Electronic system 20 includes circuit board 22, electronic device 24, fasteners 26, sequencer 30 and bias 32. Circuit board 22 serves as an electrical interface between electronic components or devices secured to circuit board 22. Circuit board 22 includes a connector portion 34 and an activation mechanism 35. Connector portion 34 is configured to facilitate the transmission of signals between circuit board 22 and electronic device 24. In one embodiment, connector portion 34 may comprise electrical sockets configured to receive electrical signal transmitting pins. In other embodiments, connector 34 may comprise electrical pins configured to project into corresponding sockets to transmit electrical signals. Connector portion 34 may comprise various connection devices configured to facilitate the transmission of electrical signals between circuit board 22 and electronic device 24.

Activation mechanism 35 comprises a mechanism configured to enable selective activation of connector portions 34 when connected to a corresponding connector portion of electronic device 24. Although activation mechanism 35 is illustrated as being provided as part of connector portion 34 of circuit board of 22, in other embodiments, activation mechanism 35 may alternatively be provided as part of a connector portion of electronic device 24.

Electronic device 24 comprises an electronic component configure to perform one or more functions for system 20. In one embodiment, electronic device 24 may comprise a processor. In such an embodiment, electronic device 24 may additionally comprise a heat sink. Electronic device includes connector portion 36 and activation access passage 40. Connector portion 36 comprises one or more structures configure to cooperate with connector portion 34 to facilitate transmission of electrical signals between electronic device 24 and circuit board 22. Connector portion 36 is configured to cooperate with connector portion 34 of circuit board 22 to form a signal transmitting connection upon being activated.

Activation access passage 40 comprises a passageway, opening, cut-out, cavity or other space providing access to activation mechanism 35. In the particular example illustrated, passage 40 is configured to facilitate insertion of an activation tool (not shown) through passage 40 and into operable engagement with activation mechanism 35 for activating the signal transmitting connection between connector portions 34 and 36. In one embodiment, passage 40 extends through a portion of electronic device 24. In other embodiments, passage 40 may extend along an exterior of electronic device 24 or maybe only partially bounded by electronic device 24.

Fasteners 26 comprise devices configured to fasten and secure electronic device 24 relative to circuit board 22. Fasteners 26 are movable between a fastened position (shown in solid lines) in which fasteners 26 mechanically connect and physically secure electronic device 24 relative to circuit board 22 and an unfastened position (partially shown in broken lines) in which electronic device 24 is not secured to circuit board 22. In particular embodiments, fasteners 26 may comprise one or more of screws, bolts, standoffs, clips or other structures which alone or in cooperation with one another facilitate releasable or removable stationary or fixed coupling of electronic device 24 to circuit board 22.

For purposes of this disclosure, the term "coupled" shall mean the joining of two members directly or indirectly to one another. Such joining may be stationary in nature or movable in nature. Such joining may be achieved with the two members or the two members and any additional intermediate members being integrally formed as a single unitary body with one another or with the two members or the two members and any additional intermediate member being attached to one another. Such joining may be permanent in nature or alternatively may be removable or releasable in nature.

Sequencer 30 comprises a mechanism formed from one or more structures configured to impede or inhibit activation of activation mechanism 35 and to impede activation of a signal transmitting connection between electronic device 24 and its mounted structure, circuit board 22, while electronic device 24 is secured to circuit board 22 by fasteners 26. Sequencer 30 is movable between a first access providing position permitting connection between connector portions 34 and 36 to be activated and a second access impeding position (shown) inhibiting activation of the signal transmitting connection.

Sequencer 30 is further configured such that fasteners 26 inhibit movement of sequencer 30 to the first position when fasteners 26 are in the fastened position.

In the particular example embodiment illustrated, sequencer 30 includes impeding portion 50, access portion 56, fastener engaging portion 60 and handle 64. Impeding portion 50 comprises that portion of sequencer 30 configured to impede, restrict or block access to activation mechanism 35 when sequencer 30 is in the access impeding position. In the particular example illustrated, impeding portion 50 extends at least partially across passage 40 to impede access to activation mechanism 35. In other of embodiments, portion 50 may obstruct access to mechanism 35 in other manners.

Access portion 56 comprises a slot, channel, cut out, opening, gap or other void in sequencer 30 configured to provide access to activation mechanism 35 when sequencer 30 is in the access providing position. In a particular example illustrated, access portion 56 is configured to be located at least partially across passage 40 to an extent sufficient to provide adequate access to activation mechanism 35 for activating the signal transmitting connection via mechanism 35. In one embodiment, the access provided by portion 56 is sufficient to facilitate insertion of a tool (not shown) through passage 40 and through portion 56 into engagement with activation mechanism 35.

Fastener engaging portion 60 comprises that portion of sequencer 30 configured to engage at least one of fasteners 26, or a structure coupled to at least one of fasteners 26 so as to move with fasteners 26, when at least one of fasteners 26 is in the fastened position so as to restrict or impede movement of sequencer 30 to the access providing position. Fastener engaging portion 60 is further configured to be moved past, across, through or otherwise at least partially by at least one of fasteners 26 when fasteners 26 are in the unfastened position (shown in broken lines) to permit sequencer 32 move to the access providing position. In the particular example illustrated, fastener engaging portion 60 comprises an edge of sequencer 30 configured to engage an edge of one of fasteners 26 when fasteners 26 are in the fastened position and to pass beneath at least one of fasteners 26 when fasteners 26 are in the unfastened position. In other embodiments, such engagement and disengagement with fasteners 26 may occur in other fashions.

Handle 64 comprises that portion of sequencer 30 configured to serve as an interface for facilitating movement of sequencer 30 between the access impeding position and the access providing position by a person. In one embodiment, handle 64 is configured to be manually grasped by a person to enable the person to move sequencer 30. In yet another embodiment, handle 64 may be configured to enable a person to engage sequencer 30 using a tool (not shown) to facilitate selective movement of sequencer 30. Although handle 64 is illustrated as projecting above electronic device 24, in other embodiments, handle 64 may extend to one side or end of electronic device 24 or may be partially enclosed or received within a portion of electronic device 24. Handle 64 may have a variety of configurations and locations.

Bias 32 comprises one or more mechanisms configured to resiliently bias or urge sequencer 30 towards the access impeding position. Bias 32 causes sequencer 30 to automatically move to the access impeding position once a person releases handle 64. In the example embodiment illustrated, bias 32 further causes sequencer 30 to move to the access impeding position upon release of handle 64 such that fasteners 26 may be moved to their fastened positions without being obstructed by sequencer 30. In one embodiment, bias 32 comprises one more springs having a first portion coupled to sequencer 30 and a second portion coupled to another structure, such as electronic device 24, fasteners 26 or circuit board 22. In another embodiment, bias 32 may comprise other resiliently biasing structures or may be omitted.

In operation, to assemble electronic device 24 to circuit board 22 and to establish signal a transmitting connection therebetween, electronic device 24 is positioned relative to circuit board 22 with connector portion 36 appropriately aligned or positioned me with respect to connector portion 34. In this position, fasteners 26 are in the unfastened position or state as shown in broken lines. Using handle 64, a person moves sequencer 30 against the bias force of bias 32 (indicated by arrow 75) in the direction indicated by arrow 77. This results in fastener engaging portion 60 being moved at least partially past fastener 26 as indicated by arrow 79 and further results in impeding portion 50 being moved to out of passage 40 and access portion 56 being moved in the direction indicated by arrow 81 at least partially across access passage 40. Once portion 56 has been sufficiently positioned across passage 40, a user may access and engage activation mechanism 35 through passage 40 and through portion 56 to activate a signal transmitting connection between connector portions 36 and 34. Upon such activation, handle 64 may be released, wherein bias 32 returns sequencer 32 the access impeding position shown. In the access impeding position shown, sequencer 30 does not obstruct movement of fasteners 26 to their fastened positions. As result, the person may actuate fasteners 26 to their fastened positions securing electronic device 24 to circuit board 22.

Because sequencer 30 inhibits activation of a signal transmitting connection between connector portions 34 and 36 while electronic device 24 is fastened or secured to circuit board 22 by fasteners 26, sequencer 30 reduces or eliminates the likelihood of damage to connector portions 34, 36, electronic device 24 or circuit board 22 brought about by such connection or assembly procedures been performed out of sequence. Moreover, bias 32 enables a person to begin such assembly steps without having to first ascertain the current positioning of sequencer 30 or of fasteners 26, reducing assembly complexity and time consumption.

Figure 2:
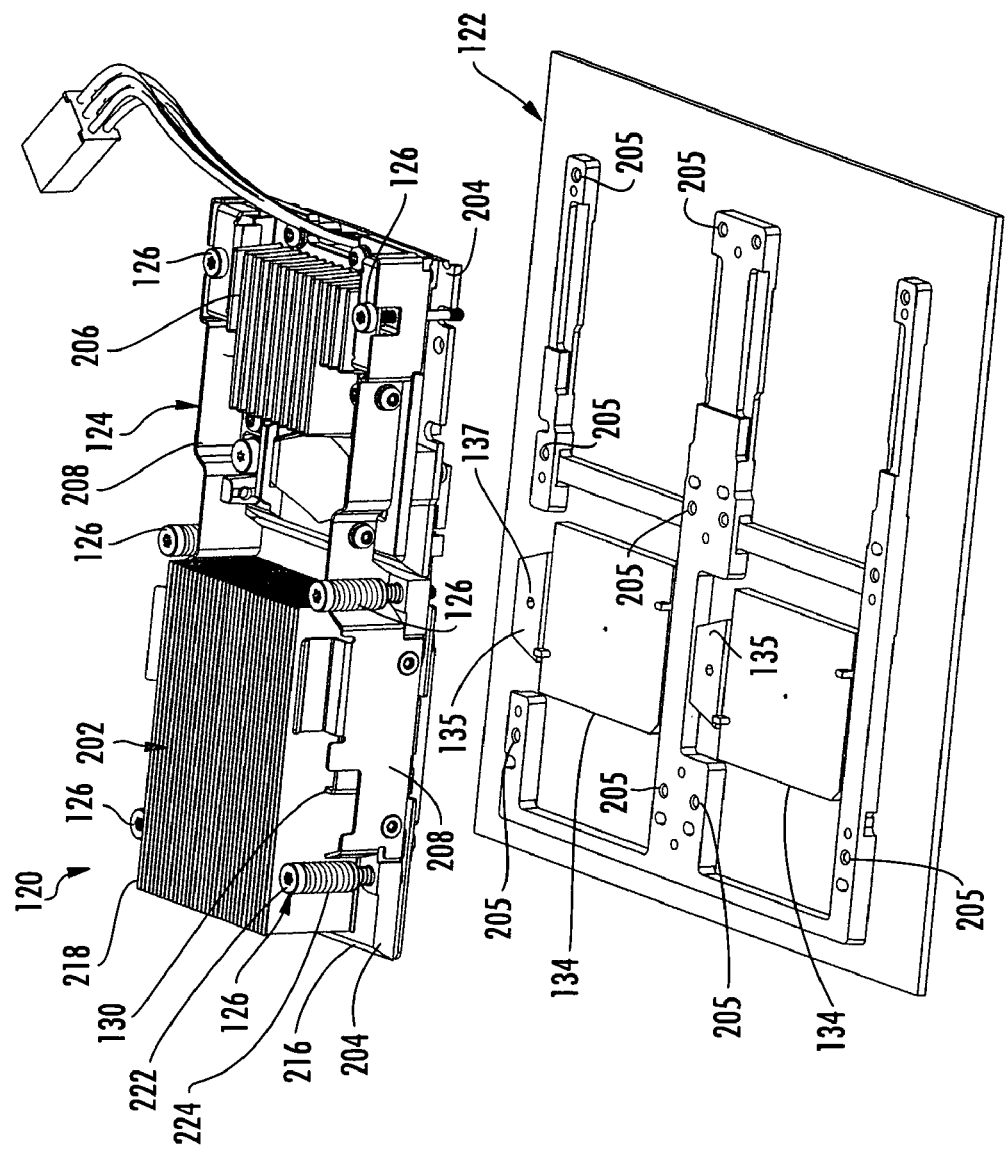
FIG. 2 is an exploded perspective view of another embodiment of the electronic system of FIG. 1 according to an example embodiment.

FIG. 2 is an exploded view illustrating an electronic system comprising a circuit board assembly 120, another embodiment of electronic system 20. Circuit board assembly 120 includes circuit board 122, electronic device 124, fasteners 126, sequencer 130 and bias 132 (shown in FIG. 3). Circuit board 122 serves as an electrical interface between electronic components or devices secured to circuit board 122. Circuit board 122 includes a connector portion 134 and activation mechanism 135. Connector portion 134 is configured to facilitate the transmission of signals between circuit board 122 and electronic device 124. In one embodiment, connector portion 34 may comprise electrical sockets configured to receive electrical signal transmitting pins. In other embodiments, connector portion 134 may comprise electrical pins configured to project into corresponding sockets to transmit electrical signals.

Activation mechanism 135 comprises a mechanism configured to enable selective activation of connector portions 134 when connected to a corresponding connector portion of electronic device 124. In the example embodiment illustrated come activation portion 135 includes and activation interface 137 by which activation mechanism 135 may be activated using a tool (not shown). In other embodiments, activation mechanism 135 may be activated in other fashions. Although activation mechanism 135 is illustrated as being provided as part of connector portion 134 of circuit board of 122, in other embodiments, activation mechanism 135 may alternatively be provided as part of a connector portion of electronic device 124.

In the particular embodiment illustrated, connector portion 134 and activation mechanism 135 comprise a cam-actuated zero insertion force micro pin grid array socket, commercially available from Tyco Electronics. In the particular embodiment illustrated, activation interface 137 is configured to be activated using a tool such as an Allen wrench. In other embodiments, connector portion 134 and activation mechanism 135 may comprise other activatable connector portions. Although circuit board 122 is illustrated as having two connector portions 134 and two activation mechanisms 135, enabling circuit board 122 to be connected to two electronic devices 124, in other embodiments, circuit board 122 may alternatively include a greater or fewer number of such electronic device mounting locations.

Electronic device 124 comprises an electronic component configure to perform one or more functions for circuit board assembly 120. Electronic device 124 includes processor 200 (shown in FIG. 3), processor heatsink 202, voltage regulator 204, voltage regulator heatsink 206 and shroud 208. Processor 200 includes, amongst other components, a processor board 210 supporting one or more processor chips (not shown) which are electrically connected to connector portion 136 and thermally couple to heat sink 202. Connector portion 136 comprises one or more structures configured to cooperate with connector portion 134 to facilitate transmission of electrical signals between electronic device 124 and circuit board 122. Connector portion 136 is configured to cooperate with connector portion 134 of circuit board 122 to form a signal transmitting connection upon being activated. In the particular example illustrated, connector portion 136 comprises an array or grid of electrical contact pins configured to be received within corresponding electrical sockets of connector portion 134 of circuit board 122. In the particular embodiment illustrated, connector portion 136 comprises a part of processor board 210, commercially available from Intel Corporation. In other embodiments, connector portion 136 may comprise other activatable connector portions.

Processor heatsink 202 comprises one more structures configured to dissipate heat generated by processor 200. Heatsink 202 generally includes a base 216 and an array of heat dissipating fins 218 thermally couple to base 216. Base 216 is thermally couple to processor 200 by one or more thermally conductive interfaces. Base 216 is further thermally coupled to fins 218 to transfer heat to fins 218 which dissipate such heat.

Figure 3:
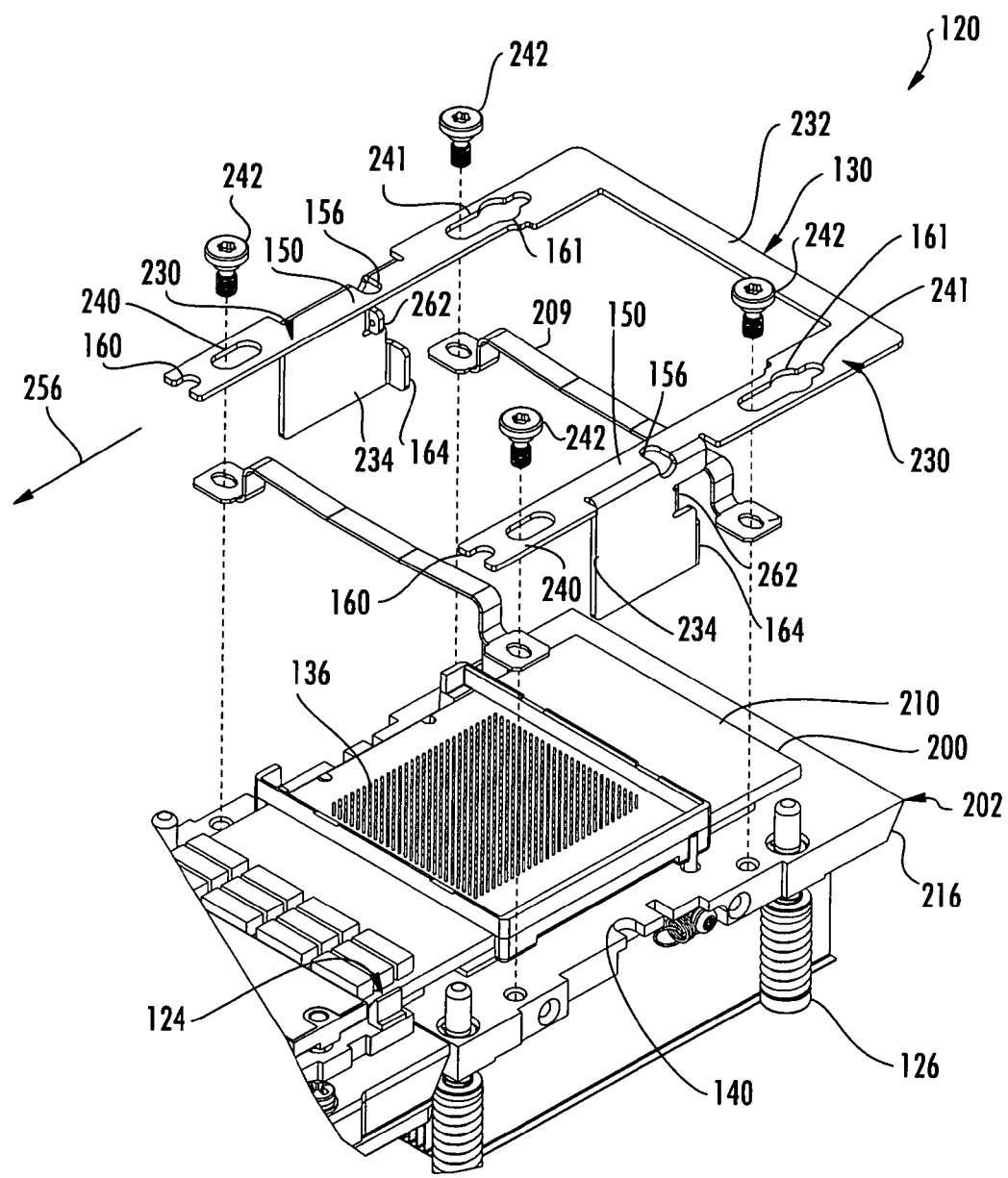
FIG. 3 is a bottom perspective view of an electronic device of the system of FIG. 2 with portions exploded away for purposes of illustrating an associated sequencer according to an example embodiment.

As shown by FIG. 3, base 216 of heatsink 202 has a cut out, opening or passage 140. Passage 140 is located so as to extend over and in substantial alignment with activation interface 137 (shown in FIG. 2) when connector portions 134 and 136 are placed in substantial alignment. Passage 140 is configured to provide access to activation mechanism 135. Passage 140 is further configured to be selectively obstructed by sequencer 130. Although illustrated as a cut out, passage 140 may alternatively be completely surrounded by base 216 of heatsink 202 or may extend through or along other structures of electronic device 124. In yet other embodiments, passage 140 may be omitted, where access to activation mechanism 135 occurs along an exterior or side of electronic device 124 when sequencer 130 is appropriately positioned.

Voltage regulator 204, sometimes referred to as a power pod or power unit, supplies and regulates voltages of electrical current to processor 200 of electronic device 124. Voltage regulator heatsink 206 is thermally couple to voltage regulator 204 and dissipates heat produced by voltage regulator 204. In other embodiments, voltage regulator 204 and heatsink 206 may have configurations other than that shown or may be omitted.

Shroud 208 comprises a pair of opposite structures or plates secure to a remainder of electronic device 124 on opposite sides of electronic device 124. Shroud 208 partially covers or conceals heatsink 202 and 206. In other embodiments, shroud 208 may be omitted.

As shown in FIG. 3, spring clip 209 comprises a resilient spring-like structure mounted to an underside of heatsink 202 about connector portion 136. Spring clip 209 provides a resilient force to assist in supporting electronic device 204 as electronic device 204 is positioned over and is rested upon circuit board 22 (shown in FIG. 2). In other embodiments, spring clip 209 may be omitted.

Fasteners 126 comprise devices configured to fasten and secure electronic device 124 relative to circuit board 22. Fasteners 126 are movable between a fastened position in which fasteners 126 mechanically connect and physically secure electronic device 124 relative to circuit board 122 and an unfastened position 1) in which electronic device 24 is not secured to circuit board 122. In the particular embodiment illustrated, fasteners 126 comprise bolts 222 and compression springs 224. Bolts 222 capture springs 224 against base 216 of heatsink 202 and extend through base 216 into internally threaded bores 205 (shown in FIG. 2) coupled to circuit board 122. In other embodiments, fasteners 126 may comprise other fastening structures or arrangements. For example, fasteners 126 may alternatively comprise one or more of screws, bolts, standoffs, clips or other structures which alone or in cooperation with one another facilitate releasable or removable stationary or fixed coupling of electronic device 124 to circuit board 122.

Figure 4:
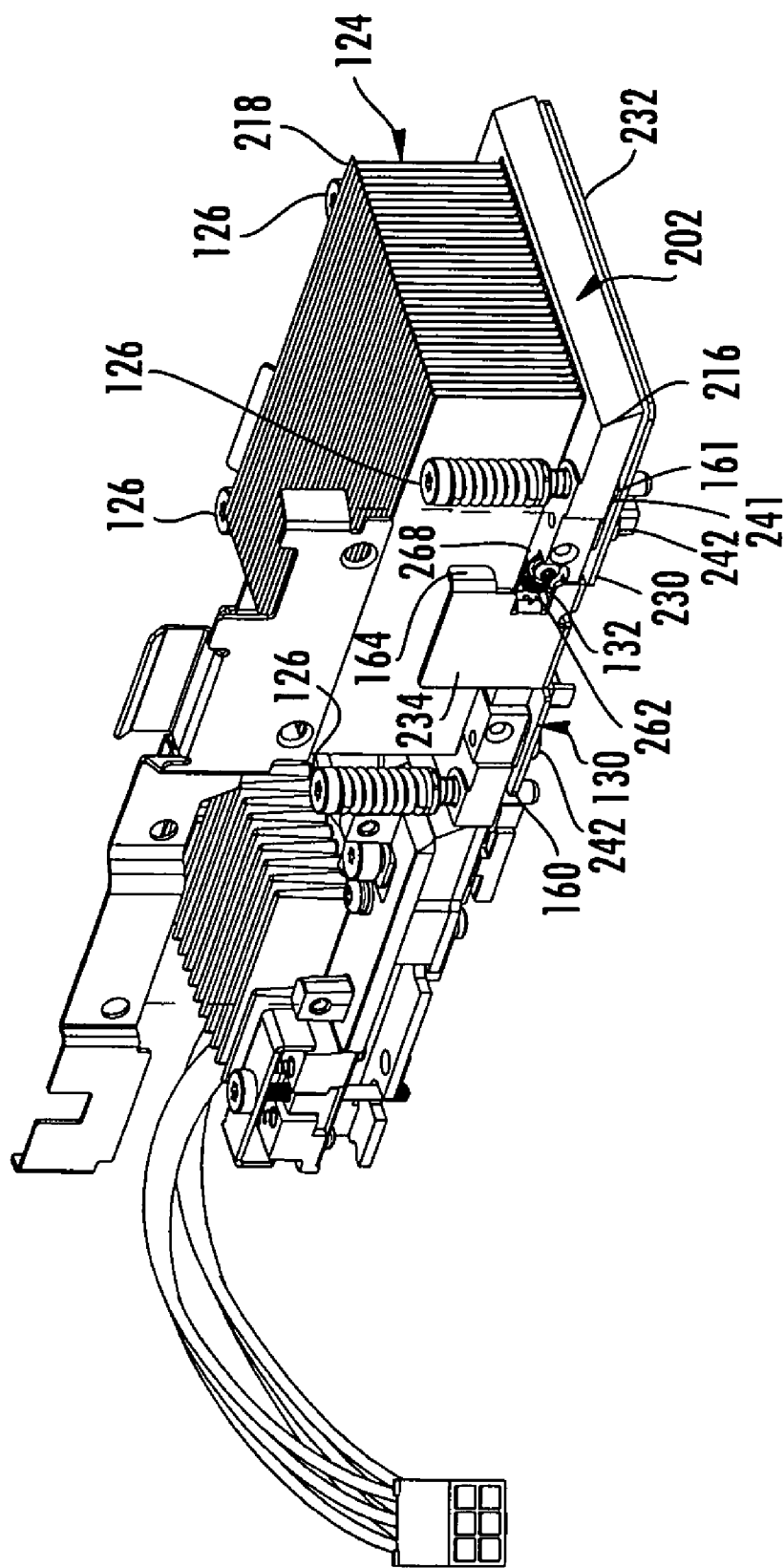
FIG. 4 is a fragmentary top perspective view of the electronic device and the sequencer of FIG. 3 with portions of the electronic device omitted for illustrating the sequencer and an associated bias according to an example embodiment.

FIGS. 3 and 4 illustrate sequencer 130 and bias 132 in more detail. FIG. 3 is a bottom perspective view of electronic device 124 substantially assembled with fasteners 126 and with sequencer 130 exploded away from device 124 for purposes of illustrating sequencer 130. FIG. 4 is an enlarged fragmentary perspective view of electronic device 124, fasteners 126, sequencer 130 and bias 132 assembled with portions of electronic device 124 omitted to better illustrate sequencer 130 and bias 132. Sequencer 130 comprises a mechanism formed from one or more structures configured to impede activation of activation mechanism 135 and to impede activation of a signal transmitting connection between electronic device 124 and its mounted structure, circuit board 122, while electronic device 124 is secured to circuit board 122 by fasteners 126. Sequencer 130 is movable between a first access providing position permitting connection between connector portions 134 and 136 to be activated and a second access impeding position (shown) inhibiting activation of the signal transmitting connection. Sequencer 130 is further configured such that fasteners 126 inhibit movement of sequencer 130 to the first position when fasteners 126 are in their fastened positions.

As shown by FIG. 3, sequencer 130 extends along an underside of electronic device 124 between electronic device 124 and circuit board 122 (shown in FIG. 2). Sequencer 230 extends along three sides of connector portion 136 and is configured to move in a plane substantially parallel to the plane of connector portion 136. Sequencer 130 extends along two opposite sides of electronic device 124 and also has a portion spanning an underside of electronic device 124.

According to one embodiment, sequencer 130 comprises a generally U-shaped structure having side portions 230, intermediate portion 232 and extensions 234. Side portions 230 extend long opposite side of electronic device 124 on opposite sides of connector portion 136. Each side portion 230 includes one or more elongate slots 240, 241, access impeding portions 150, access portions 156 and fastener engagement portions 160, 161. Slots 240, 241 are configured to slidably receive fasteners 242 to slidably secure sequencer 130 to electronic device 124. Fasteners 242 further secure spring clip 209 to electronic device 124.

Access impeding portions 150 comprise portions of side portions 230 configured to impede access to activation interface 137 of activation mechanism 135 (shown in FIG. 2) through passage 140. In particular, portions 150 are configured to extend across passage 140 when sequencer 130 is in an access impeding position such as when fasteners 126 are secured to circuit board 122 (shown in FIG. 2). In other embodiments, impeding portions 150 may have other configurations and locations.

Access portions 156 comprise openings configured to provide access to activation interface 137 of activation mechanism 135 (shown in FIG. 2) when sequencer 130 is in the access providing position. When positioned substantially across and in substantial alignment with passage 140, access portions 156 provide adequate access to activation mechanism 35 for activating the signal transmitting connection via mechanism 35. In one embodiment, the access provided by portion 56 is sufficient to facilitate insertion of a tool (not shown) through passage 140 and through portion 156 into engagement with activation interface 137 of activation mechanism 135 (shown in FIG. 2).

Fastener engaging portions 160 comprise notches or other detents configured to at least partially receive portions of fasteners 126 when fasteners 126 are in a fastened position or state in which fasteners 126 are secured to circuit board 122. Portions 160 are configured to engage fasteners 126 while still limiting movement of sequencer 130 in the direction indicated by arrow 256 such that portions 150 remain sufficiently across passages 140 to impede access to interface 137. At the same time, portions 160 facilitate alignment of sequencer 130 with respect to passages 140. In other embodiments, portions 160 may comprise openings or may omit such notches or cut outs and contact fasteners 126 in a different fashion.

Fastener engaging portions 161 comprise openings extending through side portions 230 for permitting fasteners 126 to pass therethrough into securement with circuit board 122 (shown in FIG. 2). In addition to permitting fasteners 126 to pass therethrough for securement of electronic device 124 to circuit board 122, the edges of the openings provided by fastener engagement portions 161 engage fasteners 126 when fasteners 126 are in their fastened positions to inhibit movement of sequencer 130. In particular, edges of portion 161 inhibit movement of sequencer 130 from an access impeding position to an access providing position when fasteners 126 extend through engagement portions 161 into screwed or stationary axial securement with circuit board 122. As a result, fastener engagement portions 160 and 161 ensure that all four of fasteners 126 must be withdrawn or disengaged from circuit board 122 and in unfastened positions before sequencer 130 can be moved from the access impeding position to the axis providing position in which a signal transmitting connection between connector portions 134 and 136 may be activated. Although fastener engaging portion 161 is illustrated as extending through slot 241, in other embodiments, portion 161 may extend through other portions of side portion 230.

Intermediate portion 232 extends between side portions 230 and substantially spans electronic device 124. Intermediate portion 232 facilitates movement of side portions 230 in unison with one another and rigidifies sequencer 130. In other embodiments in which sequencer 130 extends along a single side of electronic device 124, one of side portions 230 and intermediate portion 232 may be omitted.

Extensions 234 comprise portions extending from side portions 230 away from connector portion 136. Extensions 234 each include bias connection portion 262 and handle 164. Bias connection portion 262 comprises that portion of extension 234 configure to be connected to bias 132. In the particular example illustrated, bias connector portion 262 comprises a tab inwardly extending from extension 234 and configured to be connected to a spring. In other embodiments, connector portion 262 may have other configurations.

Handle 164 comprises that portion of extension 234 configured to serve as an interface for a person to move a sequencer 130. In the particular example illustrated, handle 164 extends beyond shroud 208 (shown in FIG. 2) and is configured to be contacted by a person's hand to facilitate movement of sequencer 130. In other embodiments, handle 234 may alternatively be configured to be contacted by a tool for movement of sequencer 130.

FIG. 4 illustrates one of bias 132 in more detail. Bias 132 comprises one or more mechanisms configured to resiliently bias or urge sequencer 130 towards the access impeding position. Bias 132 causes sequencer 130 to automatically move to the access impeding position once a person releases handle 164. In the example embodiment illustrated, bias 132 further causes sequencer 130 to move to the access impeding position upon release of handle 164 such that fasteners 126 may be moved to their fastened positions without being obstructed by sequencer 130. In the example embodiment illustrated, bias 132 comprises a spring having a first portion coupled to portion 262 of extension 234 of sequencer 130 and a second portion coupled to mounting portion 268 of base 216 of heatsink 202. In another embodiment, bias 132 may comprise other resiliently biasing structures or may be omitted.

Figure 5:
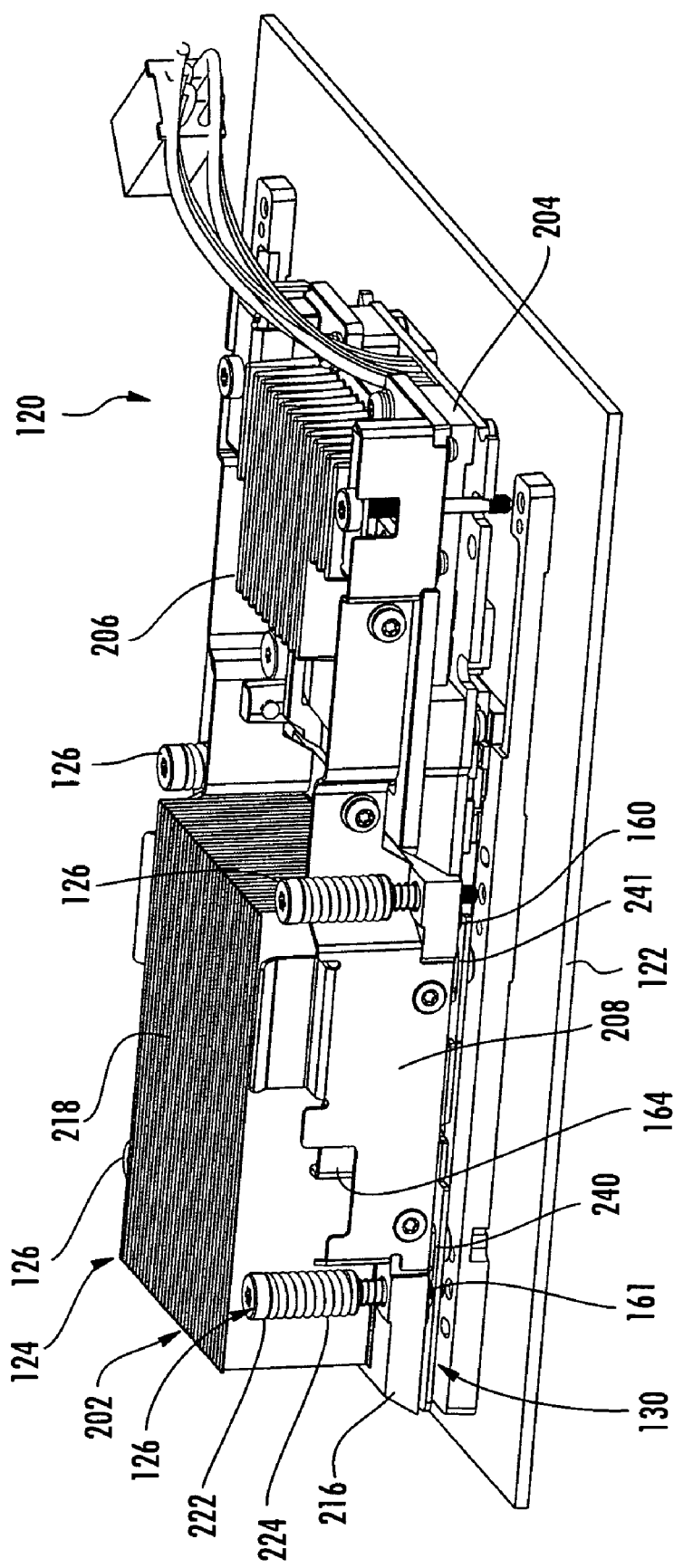
FIG. 5 is a top perspective view of the electronic system of FIG. 2 illustrating the electronic device, the sequencer and the bias positioned with respect to a circuit board according to an example embodiment.
Figure 6:
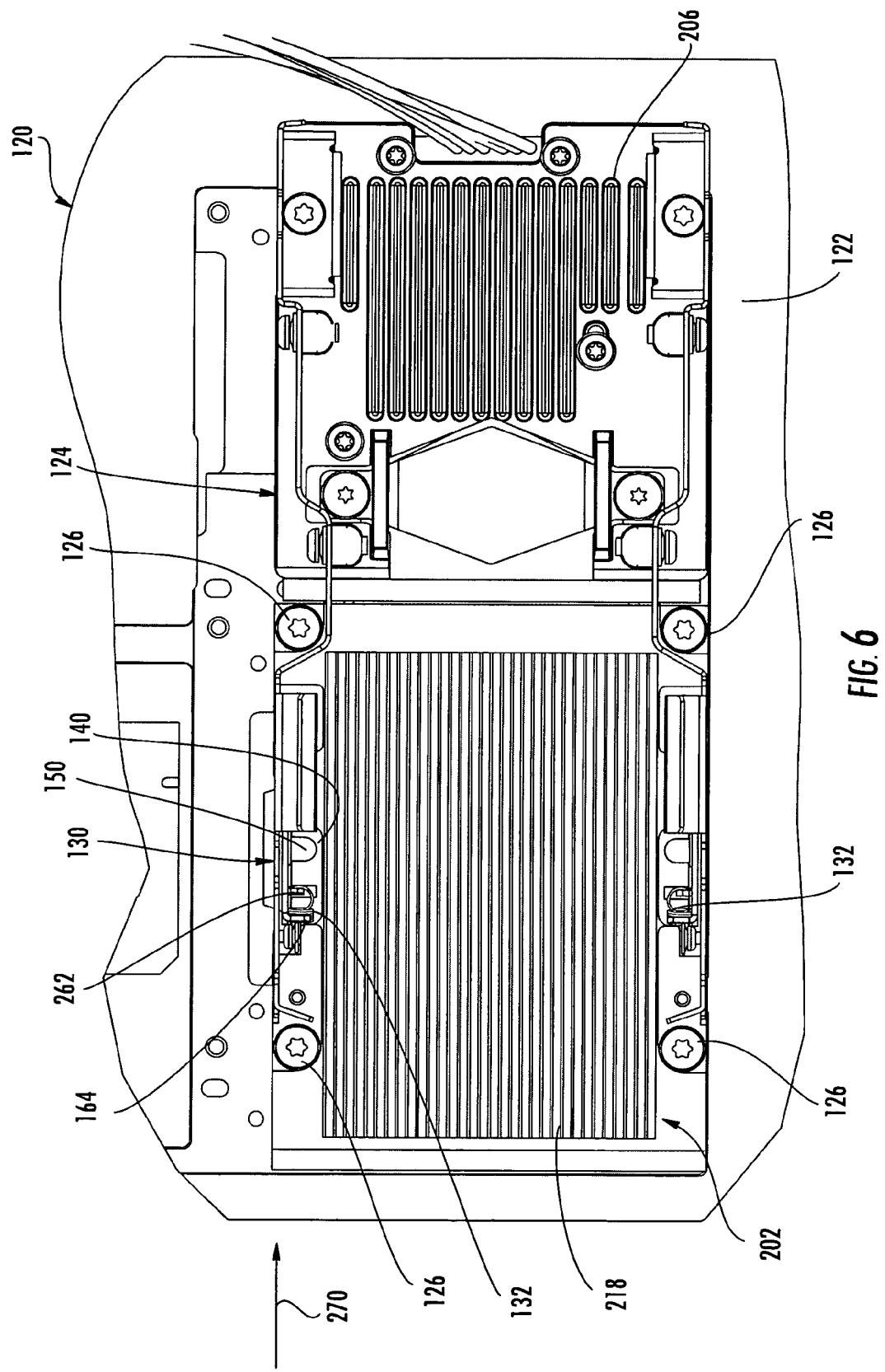
FIG. 6 is a top plan view of the electronic system of FIG. 5 illustrating the sequencer in an access impeding position according to an example embodiment.
Figure 7:
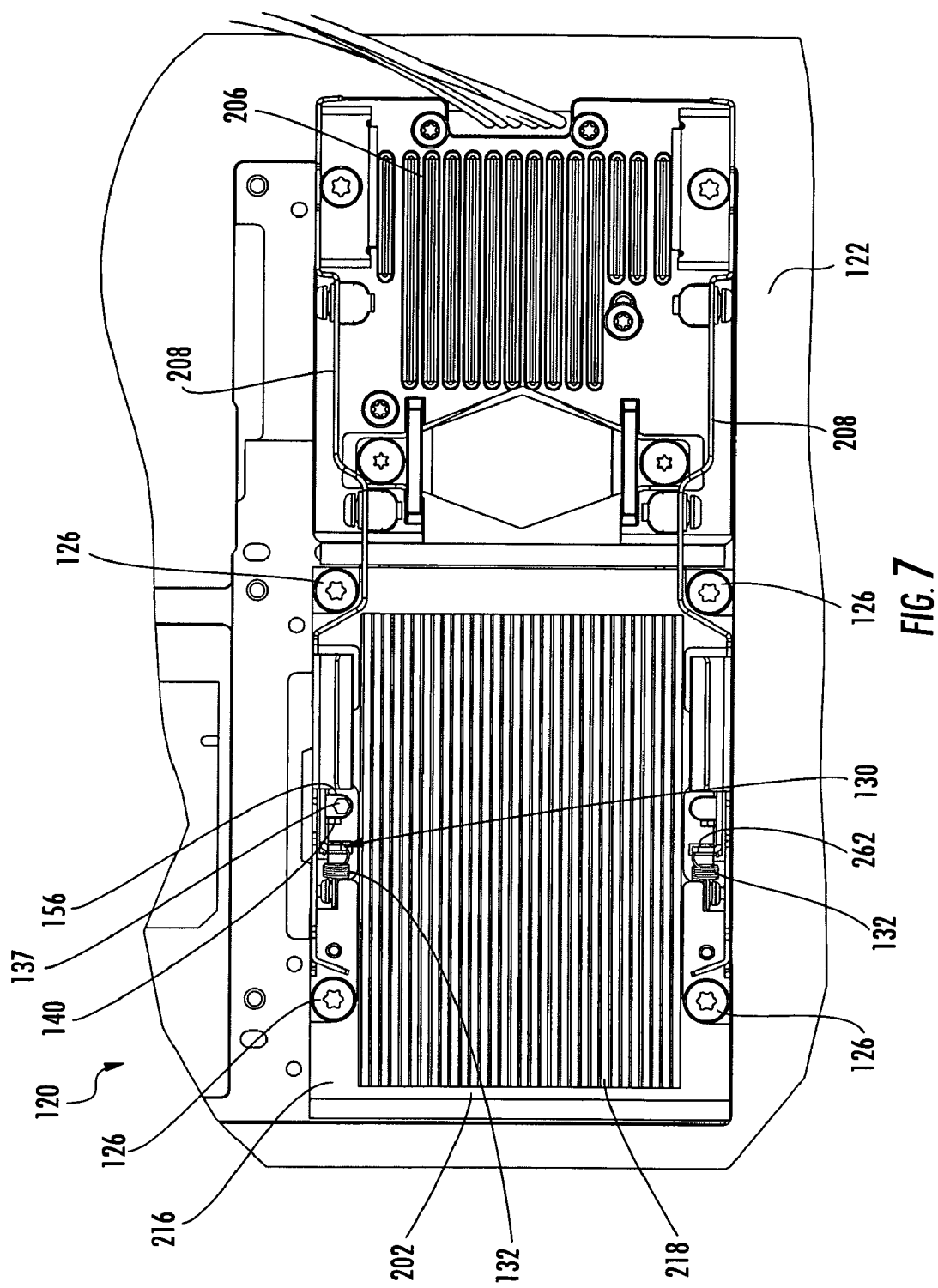
FIG. 7 is a top plan view of the electronic system of FIG. 5 illustrating the sequencer in an access providing position according to an example embodiment.

FIGS. 5-10 illustrate the connection of electronic device 124 to circuit board 122, the establishment of a signal transmitting connection between electronic device 124 and circuit board 122 and the operation of sequencer 130 and bias 132 to facilitate carrying out of the connection process in proper sequence. As shown by FIG. 5, electronic device 124 is initially placed on circuit board 122 such that connector portions (shown in FIG. 2) are in appropriate alignment with one another. As shown by FIGS. 6 and 7, handle 164 is engaged to push sequencer 130 in the direction indicated by arrow 270 to stretch or elongate bias 132, comprising a tension spring, and to slide sequencer 130 to the access providing position shown in FIG. 7 in which access portion 156 is substantially aligned with passage 140 of heatsink 202 and is substantially aligned with activation interface 137. During such movement of sequencer 130, engagement portions 160, 161 (shown in FIG. 3) move beneath fasteners 126 between fasteners 126 and circuit board 122 (shown in FIG. 2).

Once activation interface 137 is exposed, access interface 137 is engaged by a tool (not shown) to activate connector portions 134 and 136, shown in FIGS. 2 and 3, respectively, to establish a signal transmitting connection between connector portions 134 and 136. In the particular example illustrated, activation interface 137 is activated using an Allen wrench. In other embodiments where activation interface 137 has other configurations, other tools may be utilized.

Once a signal transmitting connection is activated between connector portions 134 and connector portions 136 by activating sockets of connector portion 134, handle 164 is released. As a result, bias 132 automatically slides sequencer 130 back to the access impeding position shown in FIG. 6 in which impeding portions 150 of sequencer 130 extend across passage 140 to block passage 140 and tp close off access through passage 140 to activation interface 137 (shown in FIG. 7). At the same time, fastener engagement portions 160, 161 (shown in FIG. 3) are withdrawn from beneath their opposing fasteners 126 and from between fasteners 126 and circuit board 122.

Figure 8:
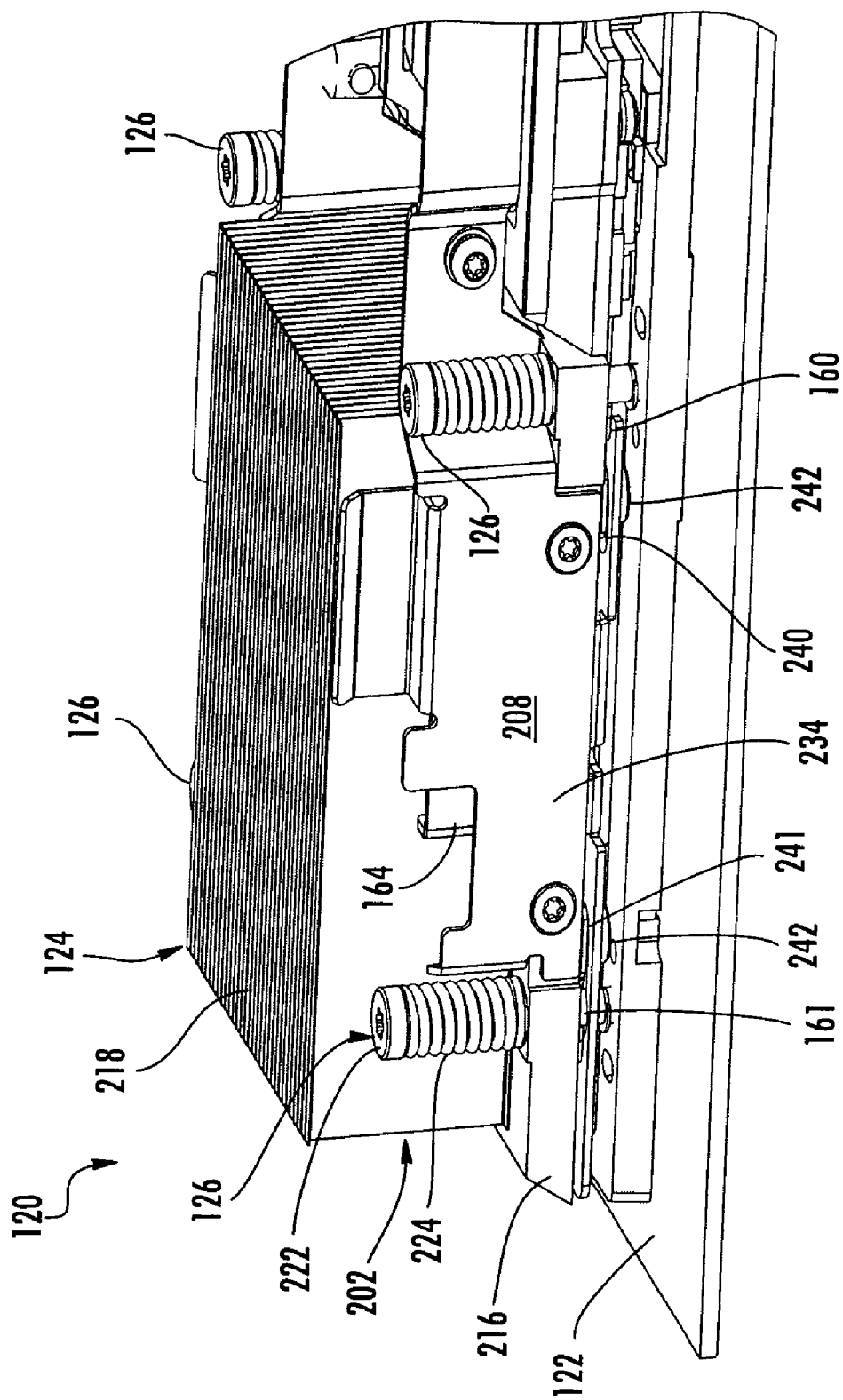
FIG. 8 is a fragmentary top perspective view of the electronic system of FIG. 5 illustrating securement of the electronic device to the circuit board with fasteners according to an example embodiment.

As shown by FIG. 8, upon activation of the signal transmitting connection between connector portions 134 and 136 (shown in FIGS. 2 and 3), and upon release of sequencer 130, fasteners 126 are actuated or moved from unfastened positions to fastened positions. In the particular example illustrated, bolts 222 are rotated against a bias provided by compression springs 224 into threaded engagement with threaded bores associated with circuit board 122 to secure electronic device 124 to circuit board 122. In other embodiments, securement of electronic device 124 to circuit board 122 using other fasteners may be achieved in other manners.

Figure 9:
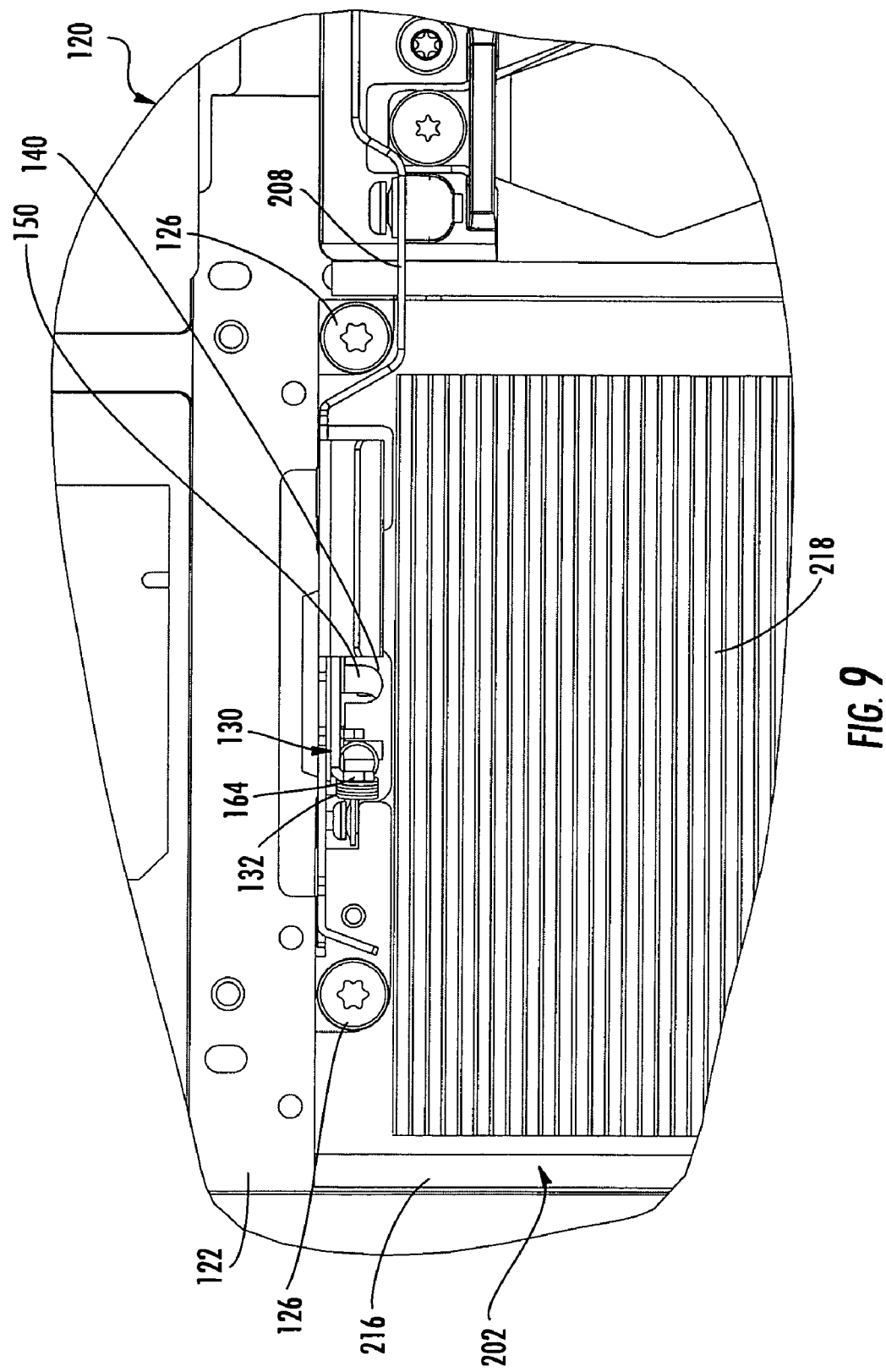
FIG. 9 is an enlarged fragmentary top plan view of the electronic system of FIG. 5 illustrating the sequencer in an access impeding position according to an example embodiment.
Figure 10:
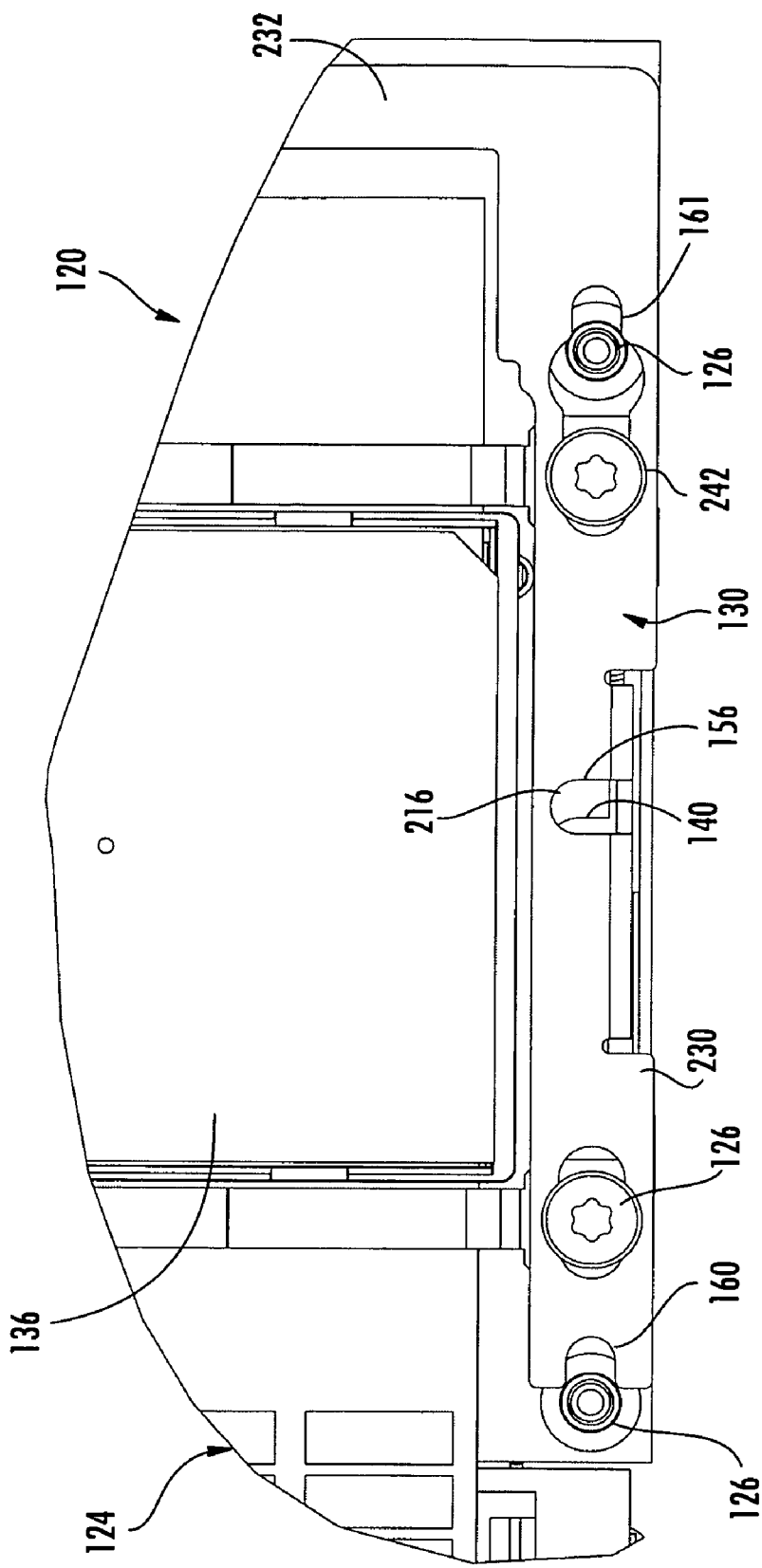
FIG. 10 is an enlarged fragmentary bottom sectional view of the electronic device secured to the circuit board by fasteners according to an example embodiment.

FIGS. 9 and 10 illustrate sequencer 130 inhibiting improper or out of sequence connection of electronic device 124 to circuit board 122. In particular, sequencer 130 prevents actuation of activation mechanism 135 while fasteners 126 are in a fastened position securing electronic device 124 to circuit board 122. As shown by FIG. 10, once fasteners 126 are in the fastened positions, secured to circuit board 122, impeding portions 150 obstruct access to activation interface 137 through passage 140. As shown by FIG. 10, if after securing fasteners 126, a person tries to slide sequencer 130 to an access providing position to try to activate activation interface 137 of activation mechanism 135, fastener engagement portions 160, 161 engage or hit fasteners 126 prior to positioning of access portion 156 across passage 140 to open passage 140 to activate interface 137. To gain access to activation interface 137 to activate the signal transmitting connection between connector portions 134 and 136, a person must first disengage all four fasteners 126 by moving all four fasteners 126 to their unfastened positions in order to move sequencer 130 to its access providing position shown in FIG. 7.

Although the present disclosure has been described with reference to example embodiments, workers skilled in the art will recognize that changes may be made in form and detail without departing from the spirit and scope of the claimed subject matter. For example, although different example embodiments may have been described as including one or more features providing one or more benefits, it is contemplated that the described features may be interchanged with one another or alternatively be combined with one another in the described example embodiments or in other alternative embodiments. Because the technology of the present disclosure is relatively complex, not all changes in the technology are foreseeable. The present disclosure described with reference to the example embodiments and set forth in the following claims is manifestly intended to be as broad as possible. For example, unless specifically otherwise noted, the claims reciting a single particular element also encompass a plurality of such particular elements.

What is claimed is:

1. An apparatus comprising:
   an electronic device comprising a first connector portion configured to be connected to a second connector portion of a circuit board to form a connection, wherein once activated, the connection transmits signals;
   a fastener movable between a fastened position in which the device is secured relative to the board and an unfastened position; and
   a sequencer movable between a first position permitting the connection to be activated and a second position inhibiting activation of the sequencer, wherein the fastener inhibits movement of the sequencer to the first position when in the fastened position.

2. The apparatus of claim 1, wherein the sequencer is resiliently biased towards the second position.

3. The apparatus of claim 2 further comprising a spring resiliently biasing the sequencer towards the second position.

4. The apparatus of claim 1, wherein the sequencer is slidably coupled to the device.

5. The apparatus of claimed 4, wherein the sequencer includes a slot and is slidably coupled to the electronic device with a fastener extending through the slot.

6. The apparatus of claim 1, wherein the sequencer extends along opposite sides of the electronic device.

7. The apparatus of claim 6, wherein the sequencer extends across the electronic device near a bottom side of the electronic device proximate the circuit board.

8. The apparatus of claim 1, wherein the connection is configured to be activated by an activation mechanism, wherein the electronic device includes a first opening permitting access to the activation mechanism and wherein the sequencer impedes access through the first opening when in the second position.

9. The apparatus of claim 8, wherein the device includes a second opening permitting access to the activation mechanism and wherein the sequencer impedes access through the second opening when in the second position.

10. The apparatus of claim 1, wherein the first connector portion and comprises one of pins and sockets configured to connect with the second connector portion which comprises the other of pins and sockets.

11. The apparatus of claim 1, wherein the electronic device comprises:
   a processor; and
   a heat sink thermally coupled to the processor.

12. The apparatus of claim 1 further comprising the circuit board including the second connector portion.

13. The apparatus of claim 1, wherein the sequencer is integrally formed as a single unitary body.

14. The apparatus of claim 1, wherein the sequencer extends along At least three sides of the first connector.

15. The apparatus of claim 1, were the sequencer includes a detent configured to at least partially receive the fastener when in the second position.

16. A sequencer for use with an electronic device having a first connector portion configured to be connected to a second connector portion of a circuit board to form a connection, wherein once activated, the connection transmits signals, and a fastener movable between a fastened position in which the device is secured relative to the board and an unfastened position, the sequencer comprising:
   one or more structures movable between a first position permitting the connection to be activated and a second position inhibiting activation of the connection, wherein the sequencer is configured such that movement of the sequencer to the first position is inhibited when the fastener is in the fastened position.

17. The sequencer of claim 16, wherein the sequencer is resiliently biased towards the second position.

* * * * *

UNITED STATES PATENT AND TRADEMARK OFFICE
CERTIFICATE OF CORRECTION

| | | |
|---|---|---|
| PATENT NO. | : 7,742,310 B2 | Page 1 of 1 |
| APPLICATION NO. | : 11/541084 | |
| DATED | : June 22, 2010 | |
| INVENTOR(S) | : Matthew D. Neumann et al. | |

It is certified that error appears in the above-identified patent and that said Letters Patent is hereby corrected as shown below:

On the Title page, in item (75), Inventors, line 2, delete "Bryan Bolich" and insert -- Bryan D. Bolich --, therefor.

In column 10, line 46, in Claim 14, delete "At" and insert -- at --, therefor.

In column 10, line 47, in Claim 15, delete "were" and insert -- wherein --, therefor.

Signed and Sealed this
Twenty-eighth Day of December, 2010

David J. Kappos
*Director of the United States Patent and Trademark Office*